(12) United States Patent
Eggert et al.

(10) Patent No.: US 10,930,095 B2
(45) Date of Patent: Feb. 23, 2021

(54) METHOD AND DEVICE FOR MONITORING CONSTRUCTION OR MINING VEHICLE ACTIVITIES

(71) Applicant: LEICA GEOSYSTEMS TECHNOLOGY AB, Stockholm (SE)

(72) Inventors: Doug Eggert, Stockholm (SE); Guilherme Oliveira, Johanneshov (SE); Damien Dusha, Annerley (AU); Stuart Gray, Albany Creek (AU)

(73) Assignee: LEICA GEO SYSTEMS TECHNOLOGY AB, Stockholm (SE)

( * ) Notice: Subject to any disclaimer, the term of this patent is extended or adjusted under 35 U.S.C. 154(b) by 198 days.

(21) Appl. No.: 16/091,980

(22) PCT Filed: Apr. 7, 2017

(86) PCT No.: PCT/SE2017/050349
§ 371 (c)(1),
(2) Date: Oct. 6, 2018

(87) PCT Pub. No.: WO2017/176207
PCT Pub. Date: Oct. 12, 2017

(65) Prior Publication Data
US 2019/0164361 A1    May 30, 2019

(30) Foreign Application Priority Data
Apr. 7, 2016  (SE) .................................. 1650472-2

(51) Int. Cl.
*G07C 5/08* (2006.01)
*G07C 5/02* (2006.01)
(Continued)

(52) U.S. Cl.
CPC ................ *G07C 5/085* (2013.01); *E02F 9/26* (2013.01); *G01P 15/18* (2013.01);
(Continued)

(58) Field of Classification Search
CPC . G01C 19/00; G07C 3/02; G07C 5/02; G07C 5/08; G07C 5/085; G01P 15/00;
(Continued)

(56) References Cited

U.S. PATENT DOCUMENTS 6,315,062 B1    11/2001  Alft et al.
2013/0274954 A1  10/2013  Jordan, Jr. et al.
(Continued)

FOREIGN PATENT DOCUMENTS

EP    1 273 723 A1    1/2003

OTHER PUBLICATIONS

Sawicki, M., et al., "MEMS sensors signal preprocessing for vehicle monitoring systems," IEEE, Signal Processing : Algorithms, Architectures, Arrangements, and Applications (SPA), pp. 349-353 (Sep. 26-28, 2013).
(Continued)

*Primary Examiner* — Dao L Phan
(74) *Attorney, Agent, or Firm* — Maschoff Brennan

(57) ABSTRACT

A method for monitoring activities of a construction or mining vehicle. Signals from at least one acceleration sensor, accelerometer (2), and/or at least one angular rate sensor, gyro (4), are processed on a computing platform (3) which is programmed to determine the activity state of the vehicle based on signals received. A device arranged to perform the method may also include a device (7) for storing or communicating the result of the determination of the computing platform (3).

16 Claims, 7 Drawing Sheets

Figure 1:
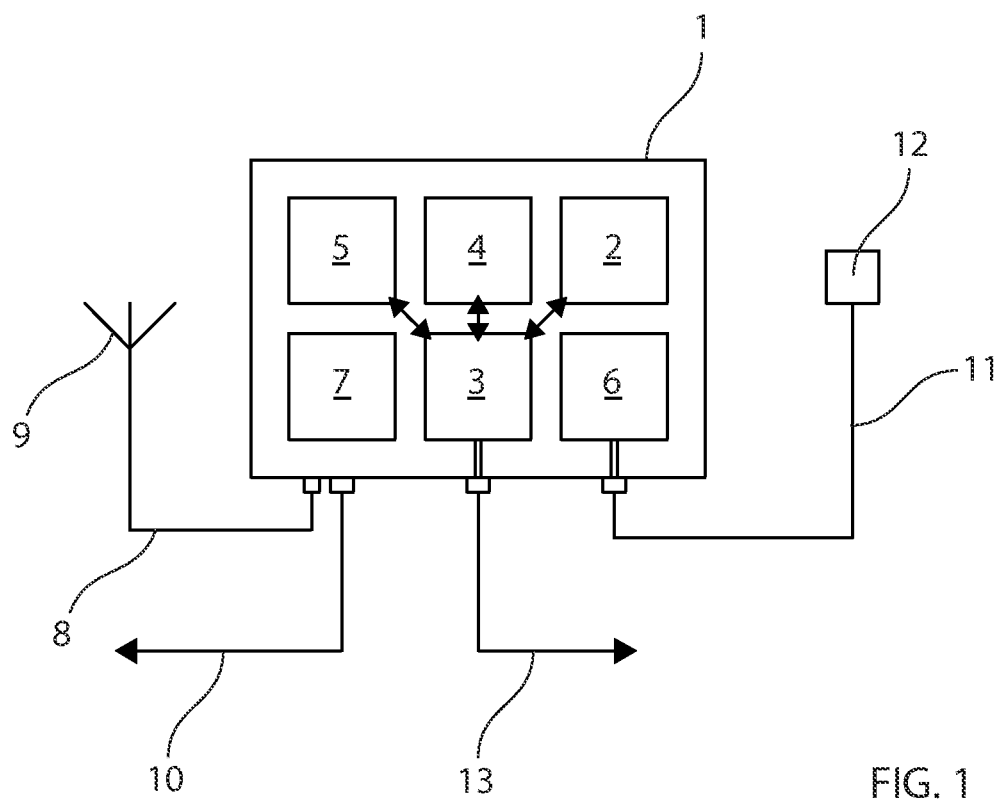

(51) Int. Cl.
- *G07C 3/02* (2006.01)
- *E02F 9/26* (2006.01)
- *G01P 15/18* (2013.01)
- *G01R 33/02* (2006.01)
- *G01S 19/47* (2010.01)
- *G01H 1/00* (2006.01)
- *G06N 20/00* (2019.01)
- *G06N 5/04* (2006.01)

(52) U.S. Cl.
CPC .......... *G01R 33/0206* (2013.01); *G01S 19/47* (2013.01); *G07C 3/02* (2013.01); *G07C 5/02* (2013.01); *G07C 5/08* (2013.01); *G01H 1/00* (2013.01); *G06N 5/04* (2013.01); *G06N 20/00* (2019.01)

(58) Field of Classification Search
CPC ..... G01P 15/18; G01R 33/0206; G01S 19/47; G06N 20/00
See application file for complete search history.

(56) References Cited

U.S. PATENT DOCUMENTS

| | | |
|---|---|---|
| 2013/0304276 A1 | 11/2013 | Flies |
| 2014/0207309 A1 | 7/2014 | Armitage et al. |
| 2015/0160070 A1 | 6/2015 | Smithers et al. |

OTHER PUBLICATIONS

Swedish Search Report dated Nov. 21, 2016 as received in Application No. 1650472-2.

Wu, H., et al., "Remote Monitoring System of Mine Vehicle Based on Wireless Sensor Network," 2010 International Conference on IntelligentComputation Technology and Automation, pp. 1015-1019 (2010).

Wu et al., "Remote Monitoring System of Mine Vehicle Based on Wireless Sensor Network", Intelligent Computation Technology and Automation (ICICTA), May 11, 2010, IEEE.

Marek et al., "MEMS sensors signal preprocessing for vehicle monitoring systems", 2013 Signal Processing: Algorithms, Architectures, Arrangements, and Applications (SPA), Poznan Univ of Technology, ISSN 2326-0262, Sep. 26, 2013.

METHOD AND DEVICE FOR MONITORING CONSTRUCTION OR MINING VEHICLE ACTIVITIES

The present invention relates to a method and a device for monitoring activities of a construction or mining vehicle, especially for monitoring a specific vehicle if it has its engine off, is idle, is working or is transiting from one place to another, without performing work.

Activity monitoring of construction or mining vehicles such as an excavator, shovel, backhoe, dozer, grader, loader, snow groomer, drill, pile driver, dump truck, light truck, roller, paver, tractor and the like is the process of determining whether a given vehicle is idle, working, has its engine off, or is transiting from one part of the site to another without performing work ("tramming"). There are many uses for this data, including its use by machine hire companies (e.g. billing based on actual working hours), machine productivity monitoring (e.g. trucks queuing), operator productivity monitoring, and maintenance purposes (e.g. scheduled servicing based on engine hours or working hours).

A reliable means of obtaining this data on modern construction or mining vehicles is to connect to the vehicle's information system ("Vehicle Bus" or "Diagnostic Bus") and listen to information such as speed, engine RPM, hydraulic pressures, operator inputs and the like. Based on this information, the working state of the vehicle can be determined.

In many instances, it is neither possible nor desirable to connect to the Vehicle Bus. There may be technical incompatibilities (whether physical, electrical or protocol) between the vehicle and activity monitor which prevents the transfer of information. On some vehicles, such as older vehicles, or light vehicles such as a site foreman's truck, a vehicle bus may not exist. Other vehicles might not supply the information crucial to activity determination method. Moreover, in some jurisdictions there may be regulatory reasons why connecting to a Vehicle Bus is undesirable, such as technical compliance standards.

Accordingly, to support the widest range of vehicles, a means of activity monitoring other than connecting to a Vehicle Bus is desirable.

Another reliable means of determining activity is to connect sensors to the various articulated members of a vehicle, such as an excavator's boom, stick and bucket. If the articulated members are moving, then the vehicle is clearly not idle and can be inferred to be performing work.

Where a vehicle is fitted with a machine control solution such as the Leica Geosystems iCON iXE2 system, then it is clearly advantageous to utilise this information for activity monitoring. However, machine control is not universal, and it is time consuming and costly for such sensors to be fitted, especially where the activity monitoring system is only fitted temporarily.

Therefore, it is strongly desirable for an activity monitoring system to be standalone from the vehicle's systems, and to be self-contained without the need to connect to external sensors.

The object of the present invention is therefore to provide a new method and a new device so that activities of construction or mining vehicles can be monitored without the need to adapt the method or device to the control system of the vehicle or the type of vehicle on which it is to be used.

The above object with the invention is met with a method in which signals from at least one acceleration sensor, accelerometer, and/or at least one angular rate sensor, gyro, are processed on a computing platform which is programmed to determine the activity state of the vehicle based on signals received.

The object to provide a new device is with the invention met with a self-contained monitoring unit comprising at least one acceleration sensor, accelerometer, and/or at least one angular rate sensor, gyro, and a computing platform which is programmed to determine the activity state of the vehicle based on signals received.

Preferably, the accelerometer is a three axis accelerometer and the gyro is a three axis gyro, allowing a device comprising the accelerometer and the gyro to be mounted at any convenient angle, simplifying both the installation process and the reliability in use. The accelerometers as well as the gyros are preferably arranged essentially orthogonally.

Further, the device according to the invention may preferably also include a Global Navigation Satellite Systems (GNSS) receiver, typically receiving signals from the Global Positioning System (GPS) and/or other systems such as the Russian GLONASS system or European Galileo system, and correspondingly the method according to the invention will include signals received from such position and/or velocity giving sensors in the processing on the computing platform for determining the activity of the vehicle.

Still further, the device according to the invention may also comprise one or more magnetic field sensors, magnetometers, preferably arranged essentially orthogonally, and correspondingly the method according to the invention will include signals received from such magnetometers in the processing on the computing platform for determining the activity of the vehicle.

With the advent of micro-electromechanical sensors (MEMS), sensors for consumer devices, one is able to construct an arrangement of said sensors at very low cost.

The array of sensors are protected by a housing suitable for mounting in the equipment bay and/or engine bay of the vehicle and is entirely self-contained, except for (if required) external power, networking, and external GNSS antenna. No sensors are required to be mounted external to the vehicle (except perhaps the GNSS antenna, which is typically mounted on the roof) saving time and cost of the installation.

Figure 2:
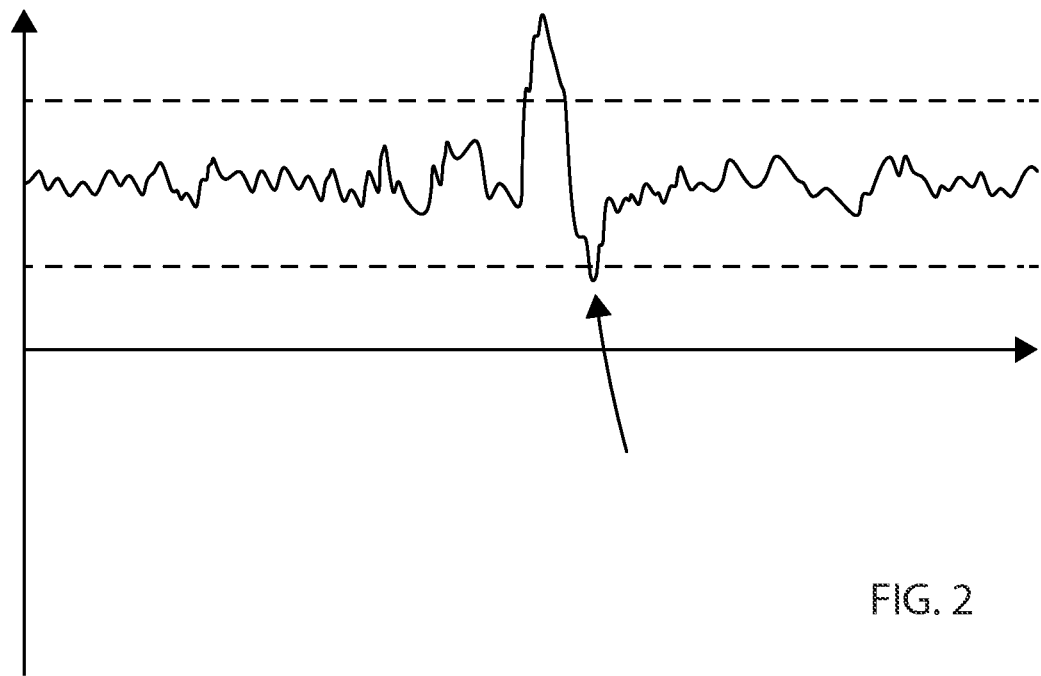
Figure 3A:
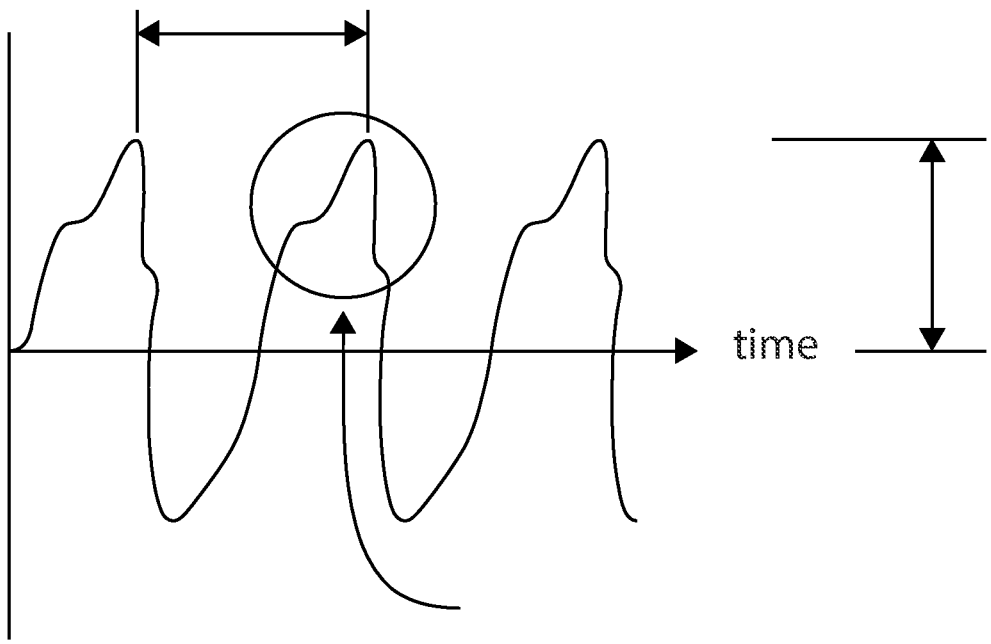
Figure 3B:
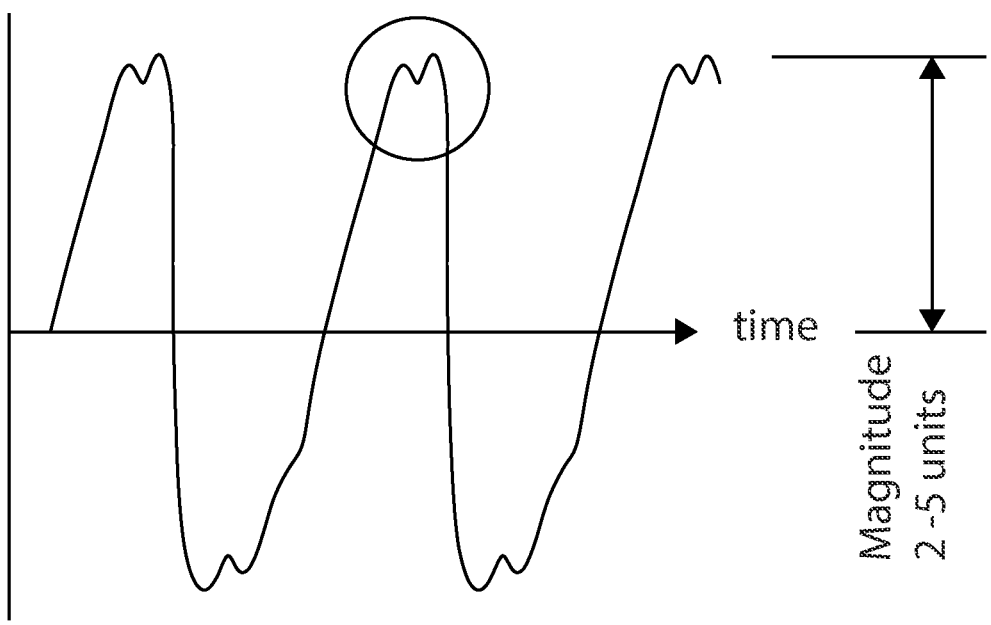
Figure 4:
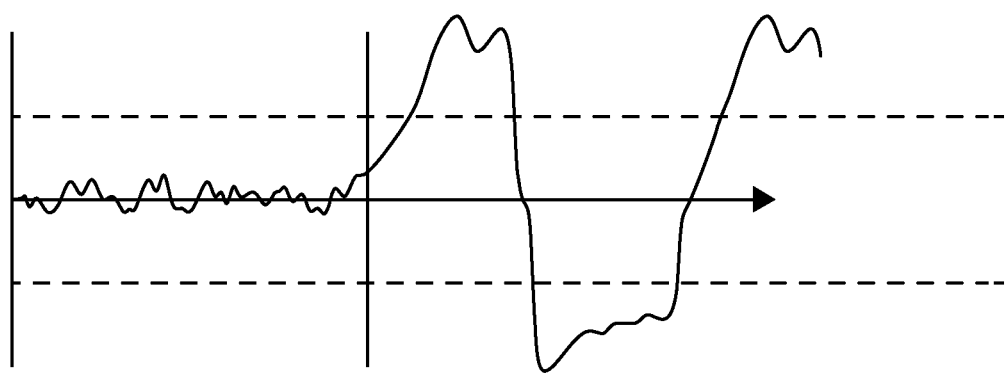
Figure 5:
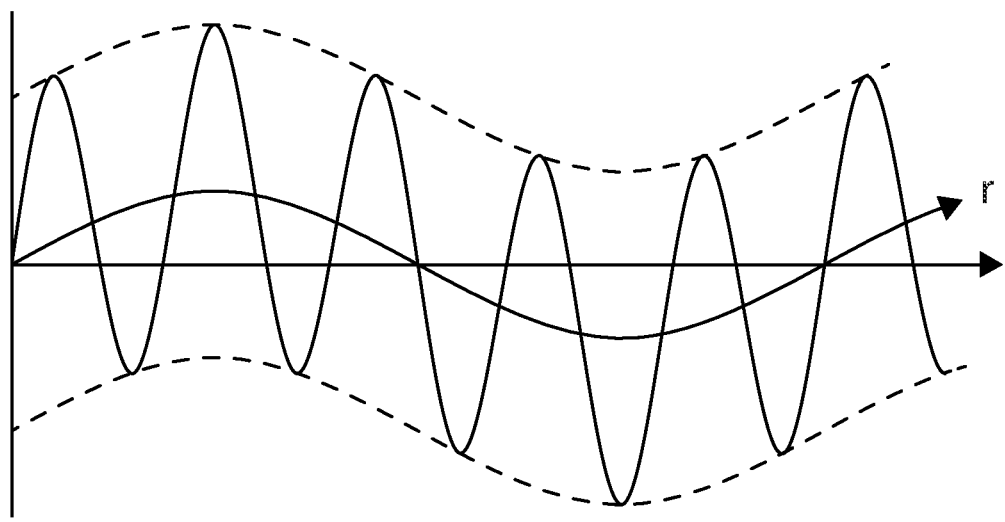
Figure 6A:
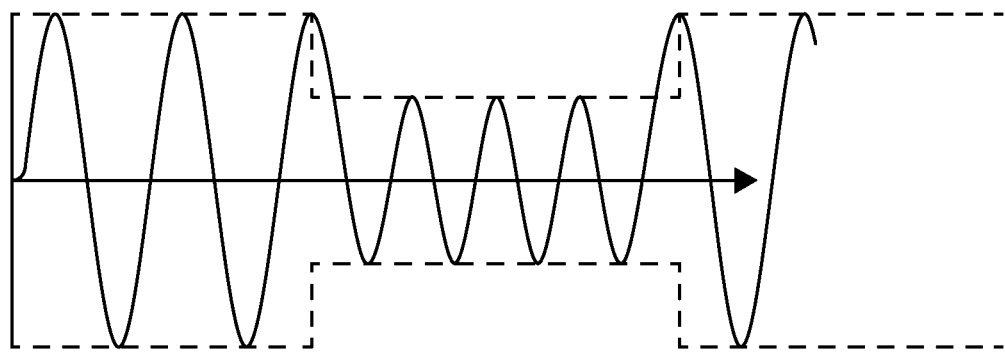
Figure 6B:
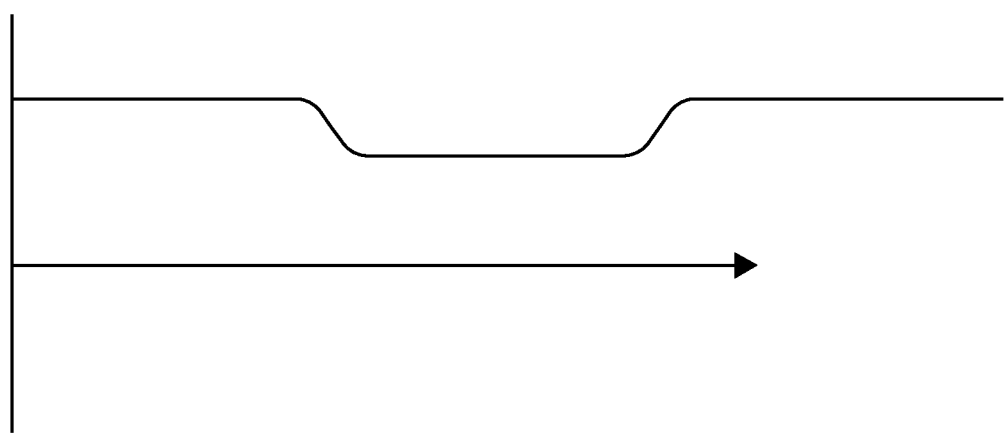

The ideas behind the present invention will here below be described with the help of the accompanying drawings to which are referred in the following text. The drawings show in FIG. 1 the basic concept in the form of a block diagram of the components of the method and device according to the invention, FIG. 2 shows the principles of signal detection according to prior art, showing the amplitude of the signal over time, FIG. 3a shows the amplitude of the signal relating to an idling first engine, FIG. 3b shows the amplitude of the signal relating to an idling second engine, FIG. 4 shows the amplitude of a signal from an engine, first with its engine off, and thereafter with engine idling, FIG. 5 shows the amplitude of the signal for a rolling vehicle, the signal being composed of engine vibration plus rocking motion, FIG. 6a shows the amplitude of the signal for a working vehicle, FIG. 6b shows the variance over time of the signal amplitude in FIG. 6.a, and FIGS. 7a-7d show a schematic flow chart over the signal processing used in the method and device according to the invention.

In FIG. 1 is thus shown the basic components for the device according to the invention, arranged in a self-contained monitoring unit 1, i.e. preferably a closed unit containing all the necessary components for carrying out the monitoring the activities of e.g. a construction or mining vehicle. The unit comprises as has been described above one or more acceleration sensors, accelerometers 2. Preferably the accelerometers are three axis accelerometers 2, preferably arranged orthogonally, and which are connected to a CPU 3, Central Processing Unit, which is the computing platform being programmed to evaluate and determine the activity of the vehicle based on the signals received. Further the monitoring unit comprises one or more angular rate sensors, gyros 4, preferably being three axis gyros and being arranged essentially orthogonally, and which also are connected to the CPU 3. The monitoring unit preferably also comprises one or more magnetic field sensors, magnetometers 5, which also preferably are arranged essentially orthogonally, and also being connected to the CPU 3. For determining the velocity and location of the vehicle the monitoring unit 1 additionally also comprises a Global Navigation Satellite Systems (GNSS) receiver 6 as mentioned above, and which also is connected to the CPU 3.

For the communication of the result of the calculations and decisions being made in the central processing unit, CPU 3, this is connected to a communications device 7, also comprised within the monitoring unit 1. The communications device 7 can be arranged to directly transmit signals, e.g. by means of a mobile data communication, e.g. by 3G or 4G.

For such a transmission it may be necessary that a cable 8 connects the communications device 7 with an antenna 9, located somewhere on the vehicle to be monitored. The communications device 7 could as an alternative be provided with a memory, storing the data from the CPU, and further be provided with a connection wire 10, or other output means (e.g. removable physical media such as a USB flash drive), for transferring the data to e.g. a central monitoring system.

The GNSS receiver 6 in the monitoring unit 1 is also preferably via a cable 11 connected with an antenna 12 on the vehicle to be monitored. Further, the monitoring unit 1 can via a power connection line 13 be connected to a power source on the vehicle, or the unit can be provided with an internal battery, preferably rechargeable.

The monitoring unit 1 as described above is preferably located in a housing, protecting the internal components from the sometimes harsh environment, in which a vehicle to be monitored is used. The housing can be provided with magnetic feet for simple magnetic mounting on the vehicle. In some types of vehicles it can be an advantage to mount the device somewhere inside the vehicle, and for other it could be better to mount it externally on the vehicle. E.g. on an excavator it could be an advantage to mount it on the roof of the excavator.

Activity monitoring of some description is a typical use case for modern MEMS sensors, as evidenced by an array of consumer devices such as the Fitbit. The activity monitoring use case for MEMS sensors so common that the functionality required for consumer devices is integrated into the same integrated circuit (IC) package as the sensor itself. For example, the Freescale MMA8451Q MEMS accelerometer can be configured to notify a computing device when it detects a change in acceleration by more than a certain amount, allowing the processor to sleep (and accordingly save power) until an event occurs which it needs to act upon.

As will be shown, this approach is entirely inappropriate for a construction vehicle. Especially when mounted in the engine bay, the sensors will pick up a sizeable amount of vibration from the engines. Even the gyros—which are nominally not sensitive to vibration—will pick up a signal due to sensor construction imperfections which cause the device to be sensitive to vibrations, and the vibrations themselves will cause a small but perceivable angular vibration component. In FIG. 2 is shown an example of the signal received from such a sensor system, wherein an upper threshold and a lower threshold have been decided, and wherein signals above and below, respectively, these levels are considered to be activities, however of unknown art of activity.

The engine vibrations are not the only signals that the sensors will measure. As the vehicle or its articulated members are moved, this will cause the chassis to make subtle rocking and rolling motions, especially when the members start or stop moving. Much stronger signals are generated when the working tool (such as a dozer blade or excavator bucket) strikes a hard material such as rock.

The vehicle is considered working in both the use cases described in the previous paragraph. If one considers an excavator performing fine finishing work in soft material such as sandy soil, then there will be few (if any) shocks due to hard material strikes and thus the subtle rocking and rolling motions must be detected to determine the working state.

Especially for finishing work where the articulated motions are slow and deliberate, the signal caused by these subtle rocking and rolling motions can be buried within the signal caused by the engine vibration. Therefore, the approach of setting a threshold above which activity is said to occur is not a suitable approach for construction or mining vehicles. This invention introduced a method to overcome these difficulties to reliably perform activity detection on a construction or mining vehicle.

The signals caused by engine vibration, by shocks due to striking material, and by rocking and rolling motion of the chassis cannot be easily predicted. For the engine vibration, the RPM of the engine at idle of each vehicle is different, the generated harmonics are different, and the alteration of the signal induced as the vibrations are transmitted through the chassis are generally unpredictable without extensive study of the vehicle in question. In FIGS. 3a and 3b are shown signals from two different engines at idle, which differ in shape, period and amplitude. Shocks caused by material strikes will differ in character depending on the material being worked on, the force of the impact and the dynamics of the vehicle. Similarly, the rocking and rolling motions will differ depending on material on which the vehicle sits, how the articulated members are operated and the dynamics of the vehicle. Accordingly, there is no specific signature known prior that can be searched for in order to detect activity.

If the engine of the vehicle is off, then the only signal acting on the sensors is noise, bias, and geodetic stimuli such as gravity, or the Earth's rotation rate, depending on the sensor in question. After removing the stimuli and bias, both of which will be approximately constant over seconds to minutes, then one need only determine whether the engine vibration signal is present on the sensors, which will be large relative to the noise on the sensor. Accordingly classic activity detection techniques may be used. This is shown in FIG. 4, in which the amplitude of a signal from an engine to the left is shown with its engine off, and to the right with the engine idling When the vehicle is idle with the engine running, no articulated members are being moved and no material is being worked. Therefore, the only signal acting on the sensors—other than noise, bias and geodetic stimuli previously described—is engine vibration. In this state, the character of the measured signal is constant over seconds or minutes. That is, one would expect the statistical distribution of the signal (or temporal subsets of the signal) to be essentially constant over time. Moreover, one would also expect that parameters derived from the signal (or temporal subsets of the signals), and the statistical distribution of said parameters will also be essentially constant over time. Thus, if measures of the statistical distribution of the signal, or measures of the statistical distribution of parameters derived from the signal change over time, then it can be determined that the vehicle is not idle.

The remaining problem is to select the parameters to be derived from the signal, and to determine how to characterise the statistical distribution of the signal and derived parameters. There is almost a limitless choice of parameters which may be calculated from a given signal, but to keep the cost of the computational platform as low as possible, favour should be given to measures that are of low computational cost and can be calculated reliably using integer arithmetic.

One way that the statistical distribution of the signal, and parameters derived from the signal, can be described is by "summary statistics", which generally includes one or more descriptions of the central tendency (for example, the mean), one or more descriptions of dispersion (e.g. variance), and one or more descriptions of the shape (e.g. kurtosis). All the examples given—mean, variance and kurtosis—are computationally cheap operations on integer arithmetic, requiring only a few arithmetic operators to update the statistics regardless of the number of samples in the temporal subset being monitored ("constant time"), and requiring memory only for the number of samples in the temporal subset being monitored ("linear in time"). Accordingly, these calculations are suitable for a low-cost microcontroller such as an ARM Cortex-M series.

To determine whether the signal or a parameter derived from the signal has changed over time, one may perform linear regression of the signal over time and test whether the slope coefficient is statistically indistinguishable from zero. Since what constitutes "statistically indistinguishable" is directly dependent upon a specified level of confidence, this test is well approximated by using a fixed threshold (or threshold with hysteresis) on the slope value. When the sampling rate from the sensors is constant, then linear regression can be implemented as a constant time operation, which makes it suitable for implementation on a low-cost microcontroller. Moreover, the parameters estimated during linear regression—slope, intercept, and the variance of the both the regressor and regressed parameters—correspond to the summary statistics of interest.

Changes of the signal in both central tendency (e.g. mean) and dispersion (e.g. variance) are both good indicators of working activity; the mean of an accelerometer signal will change as the chassis undergoes rocking motion due to a change in the component of measured gravity, and the spread will change with engine RPM which often happens when under load when a tool is manipulating material (e.g. a bucket digging). Shocks caused by material strikes will clearly cause a change in the dispersion of the signal. Changes on the gyros measurements, GNSS measurements or magnetometer measurements may be similarly inferred. Thus, the activity monitoring may be performed as follows:

1. Linear regression is performed on the sensor of interest, resulting in a set summary statistics of the signal.
2. Linear regression is performed on each of the summary statistics produced in the previous step.
3. Parameters calculated from the linear regression together with the summary statistics, and the raw signal itself creates a set of descriptors.
4. The set of descriptors are combined to determine whether the system is idle or non-idle.

How the descriptors are combined is the subject of a field of study known as classification theory. Multiple different classification techniques exist, including decision trees, support vector machines, neural networks, linear discriminant analysis, k-nearest neighbour and Bayesian classifiers. For a very low-cost microcontroller, a decision tree constructed with a carefully selected set of thresholds is adequate for classification. Formal training techniques may be used to construct the decision tree. Other classification techniques may be used where there is sufficient computational power.

If significant computational resources are available, more sophisticated signal parameters and statistical tests may be utilised. For example, changes in spectral coefficients correspond to changes in RPM (indicating work), or changes in wavelet coefficients which indicate changes in the shape or pattern of the signal. Changes in the statistical distribution can be tested by performing formal techniques such as Levene's test. Neither changes the fundamental principle of looking for changes in the statistical distribution of the signal, or parameters derived from the signal.

For some vehicles, determining that a vehicle is not idle is sufficient to infer that a vehicle is working. For example, a dump truck is working when it is carrying material from one part of the site to another, or returning to transport another load. For vehicles that are mostly stationary whilst working, such as an excavator, then one needs to differentiate between working and tramming. When equipped with a GNSS receiver, one may monitor how the position of the vehicle changes over time. If the positions are confined to a small arc, then the excavator is working. If the excavator travels a significant distance during the monitored time, then the excavator is tramming.

Figure 7A:
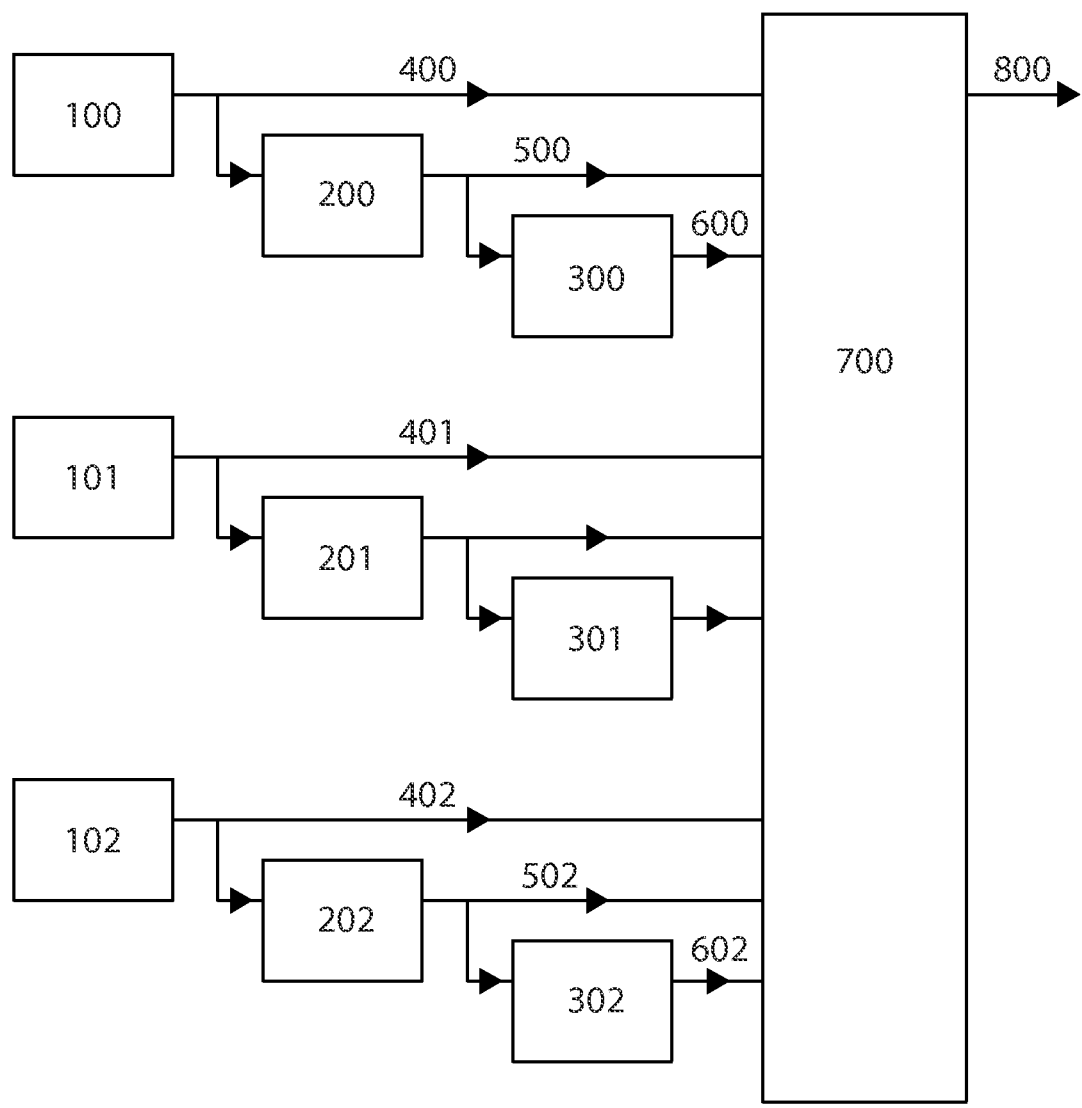

FIG. 7a is an overview of the signal flow.

The raw signals (400, 401, 402) from each sensor (100, 101, 102), e.g. accelerometers, gyros, GNSS-receivers, magnetometers, are processed by a corresponding block (200, 201, 202) to create a set of corresponding signal characteristic(s) (500, 501, 502).

The sensor characteristic(s) derived from each sensor signal (500, 501, 502) are monitored for changes by corresponding block (300, 301, 302) processing and creating a set of metric(s) (600, 601, 602) related to the change in said signal characteristics.

The raw signals (400, 401, 402), signal characteristics (500, 501, 502) and change metrics (600, 601, 602) together form a set of descriptors which are supplied to a classifier 700.

Based on the set of descriptors, the classifier selects the corresponding activity type 800.

Figure 7B:
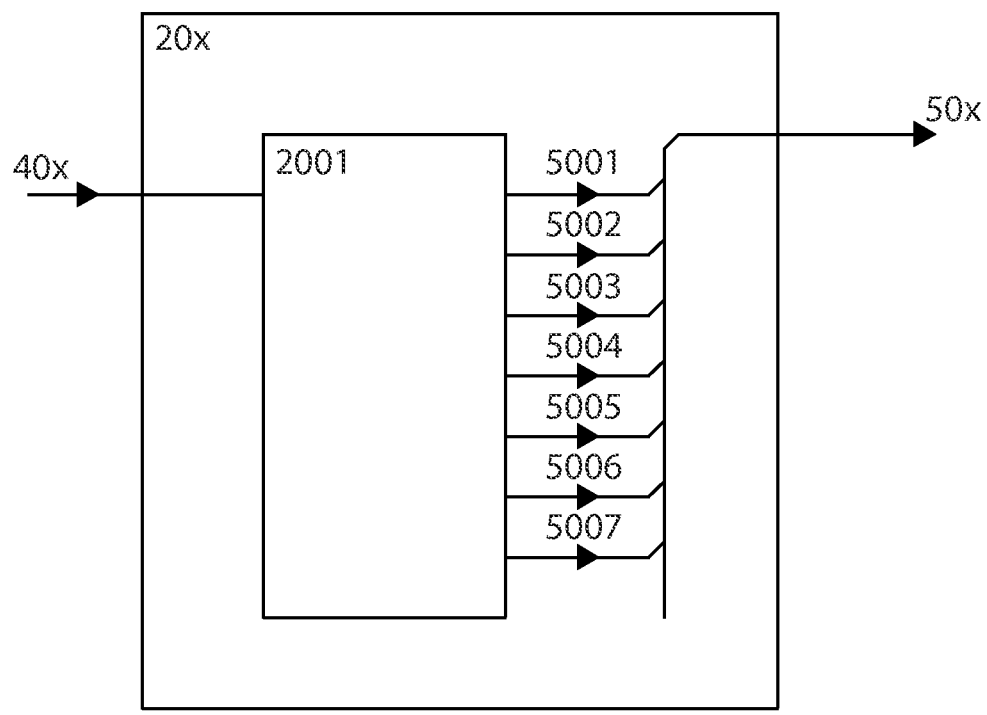
Figure 7C:
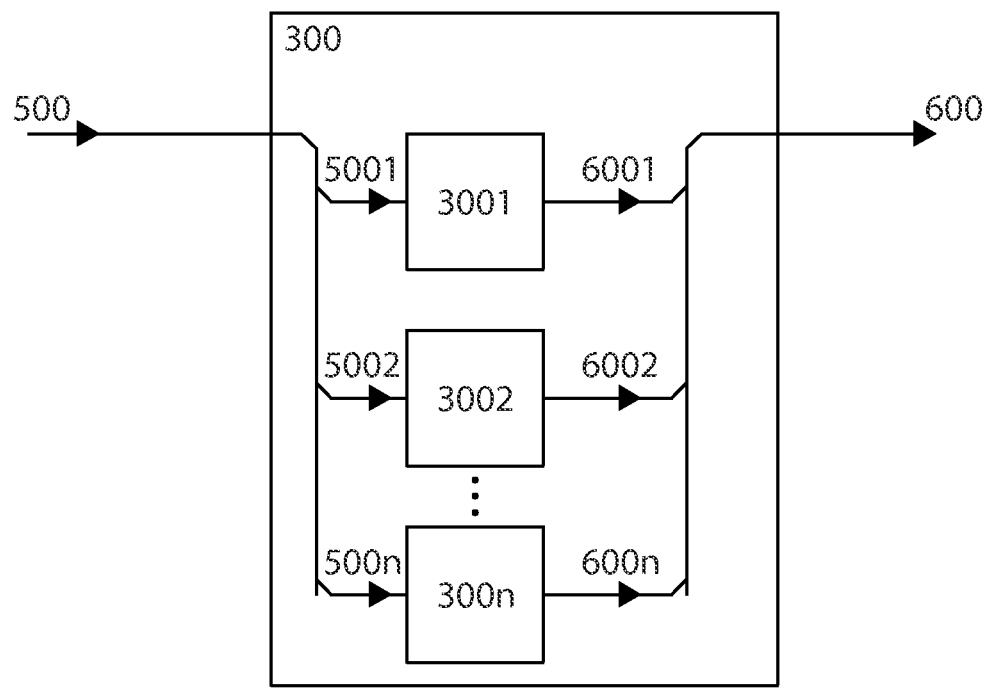
Figure 7D:
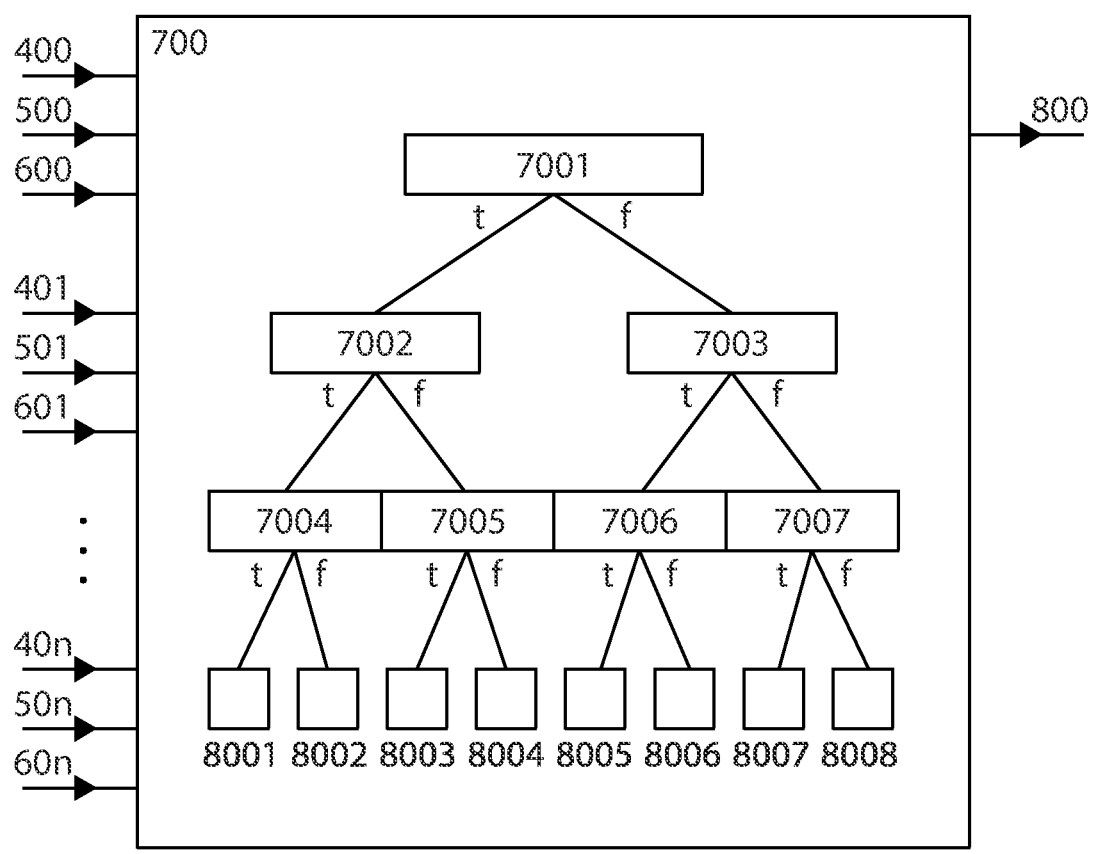

The remaining sub-FIGS. 7b-7d describe the preferred workings of each block.

FIG. 7b shows a block for calculating the signal characteristics (20$x$) from sensor x (100-102). In the preferred form, it does so via a moving linear regression filter (2001), which produces a number of parameters, slope (5001), intercept (5002), slope variance (5003), intercept variance (5004), slope-intercept cross-covariance (5005), data variance (5006), coefficient of determination (5007), all of which can be considered as signal characteristics. If certain characteristics are not useful for classification, they need not be calculated. (40$x$) indicates the raw data received from sensor x (e.g. 400, 401, 402) and (50$x$) the corresponding resulting sensor signal characteristics.

Linear regression is not the only means of producing signal characteristics—as has already been covered in the text above.

FIG. 7c shows the block which monitors for changes in the signal characteristics (300, 301, 302). It takes the signal characteristics (500) as inputs and outputs a set of metrics (600) corresponding to the change in the corresponding characteristic. The preferred means of doing so is linear regression, where the outputs—especially slope and variance—are indicative of changes as described in the text. (5001, 5002, . . . , 500n) indicates the individual signal characteristic, (3001, 3002, . . . , 300n) the corresponding linear regression filter, and (6001, 6002, . . . , 600n) the metrics of change, derived from linear regression.

As mentioned above linear regression is not the only means of monitoring for signal changes. Other means have been described in the text.

FIG. 7d shows the classification process 700. It takes the set of descriptors from each sensor (400-60n) and processes them to output the classified activity type 800. The preferred means is a decision tree, which implements cascading set of tests (7001-7007) on selected descriptor values. The "leaves" at the base of the "tree"—which may have any number of layers—an activity type is selected (8001-8008). The designer of the classifier may select the number of tree layers to use. The tree may be constructed heuristically (i.e. by manually examining data and selecting which descriptors and thresholds to use), or by automated training means.

A decision tree is not the only means of performing classification. A list of possible classification means are included in the text above.

The invention claimed is:

1. A method for monitoring activities of an excavator, comprising:
   processing, on a computing platform, signals from at least one acceleration sensor, accelerometer, angular rate sensor, or gyro; and
   determining an activity state of the excavator based on whether measures of the statistical distribution of the signals, or measures of the statistical distribution of parameters derived from the signals change, or do not change, over time, wherein the activity state includes at least one of idle with the engine on, or is working.

2. A method according to claim 1, wherein the activity state of the excavator as determined further comprises at least one of whether the excavator has its engine off, or is transiting from one place to another, without performing work.

3. A method according to claim 1, further comprising:
   receiving, using a Global Navigation Satellite Systems (GNSS) receiver, position and/or velocity giving signals, wherein the position and/or velocity giving signals are used to further determine the activity state of the excavator.

4. A method according to claim 1, wherein activity state of the excavator is further determined using signals received from one or more magnetic field sensors or magnetometers.

5. A method according to claim 1, wherein the parameters derived from the signals are one or more of the summary statistics of a temporal subset of said signal, wavelet coefficients of a temporal subset of said signal, or spectral coefficients of a temporal subset of said signal.

6. A method according to claim 1, wherein parameters derived from the signals are described by means of one or more of linear regression, or a formal statistical test.

7. A method according to claim 1, wherein determining the activity state comprises performing a monitoring process using a classifier.

8. A method according to claim 7, wherein the classifier is one of the decision tree, support vector machine, neural network, k-nearest neighbor classifier, linear discriminant analysis, or Bayesian classifier.

9. A device for monitoring activities of an excavator, comprising:
   a self-contained monitoring unit including:
      at least one acceleration sensor, accelerometer, angular rate sensor, or gyro providing signals; and
      a computing platform that is programmed to determine an activity state of the excavator based on whether measures of the statistical distribution of the signals, or measures of the statistical distribution of parameters derived from the signals change, or do not change, over time, wherein the activity state includes at least one of idle with the engine on, or is working.

10. A device according to claim 9, further comprising a communications device to communicate, or a storing device to store, information representing the activity state determined by the computing platform.

11. A device according to claim 9, wherein the activity state of the excavator as determined further comprises at least one of whether the excavator has its engine off, or is transiting from one place to another, without performing work.

12. A device according to claim 9, wherein the accelerometer is a three axis accelerometer.

13. A device according to claim 9, wherein the gyro is a three axis gyro.

14. A device according to claim 9, further comprising a Global Navigation Satellite Systems (GNSS) receiver that receiving position and/or velocity giving signals, wherein the computing platform further uses the position and/or velocity giving signals to determine the activity state of the excavator.

15. A device according to claim 9, further comprising one or more field sensors or magnetometers, wherein the computing platform further uses signals received from the one or more field sensors or magnetometers to determine the activity state of the excavator.

16. A device according to claim 9, wherein the gyro is a three axis gyro, arranged essentially orthogonally.

* * * * *